(12) United States Patent
Su et al.

(10) Patent No.: US 10,414,136 B2
(45) Date of Patent: Sep. 17, 2019

(54) HALOGEN-FREE AND PHOSPHORUS-FREE SILICONE RESIN COMPOSITION, PREPREG, LAMINATE BOARD, COPPER-CLAD PLATE USING THE SAME, AND PRINTED CIRCUIT BOARD

(71) Applicant: Shengyi Technology Co., Ltd., Guangdong (CN)

(72) Inventors: Xiaosheng Su, Guangdong (CN); Suwen Ye, Guangdong (CN); Guofang Tang, Guangdong (CN)

(73) Assignee: Shengyi Technology Co., Ltd., Guangdong (CN)

( * ) Notice: Subject to any disclaimer, the term of this patent is extended or adjusted under 35 U.S.C. 154(b) by 0 days.

(21) Appl. No.: 15/539,291

(22) PCT Filed: Jul. 6, 2015

(86) PCT No.: PCT/CN2015/083407
§ 371 (c)(1),
(2) Date: Jun. 23, 2017

(87) PCT Pub. No.: WO2016/101588
PCT Pub. Date: Jun. 30, 2016

(65) Prior Publication Data
US 2017/0354032 A1    Dec. 7, 2017

(30) Foreign Application Priority Data

Dec. 26, 2014  (CN) .......................... 2014 1 0827640

(51) Int. Cl.
| | |
|---|---|
| B32B 27/28 | (2006.01) |
| C09J 183/04 | (2006.01) |
| B32B 15/20 | (2006.01) |
| B32B 15/08 | (2006.01) |
| B32B 27/04 | (2006.01) |
| C08J 3/09 | (2006.01) |
| H05K 1/03 | (2006.01) |
| B32B 15/082 | (2006.01) |
| B32B 27/20 | (2006.01) |

(52) U.S. Cl.
CPC ............ B32B 27/283 (2013.01); B32B 15/08 (2013.01); B32B 15/082 (2013.01); B32B 15/20 (2013.01); B32B 27/04 (2013.01); B32B 27/20 (2013.01); C08J 3/09 (2013.01); C09J 183/04 (2013.01); H05K 1/03 (2013.01); H05K 1/0353 (2013.01); B32B 2307/3065 (2013.01); B32B 2457/08 (2013.01)

(58) Field of Classification Search
None
See application file for complete search history.

(56) References Cited

U.S. PATENT DOCUMENTS

| | | | | |
|---|---|---|---|---|
| 4,988,779 | A  * | 1/1991 | Medford | ................ C09J 183/04 525/478 |
| 5,576,110 | A  * | 11/1996 | Lin | ........................ C09J 183/04 428/447 |
| 5,969,210 | A  * | 10/1999 | Sharma | .............. C07K 14/4702 424/9.2 |
| 6,201,055 | B1 * | 3/2001 | Lutz | ....................... C09J 183/04 524/493 |
| 2002/0082377 | A1 | 6/2002 | Bohin et al. | |
| 2002/0146575 | A1 | 10/2002 | Shudo | |
| 2010/0055334 | A1 * | 3/2010 | Kim | ..................... C09D 183/04 427/387 |
| 2013/0200554 | A1 * | 8/2013 | Mueller | ..................... C08J 3/24 264/477 |
| 2013/0323428 | A1 * | 12/2013 | Ochs | ...................... C08L 83/04 427/331 |
| 2014/0199909 | A1 * | 7/2014 | Yamaguchi | .......... C09D 183/04 442/233 |
| 2015/0299533 | A1 * | 10/2015 | Koellnberger | ......... C08G 77/12 525/100 |

FOREIGN PATENT DOCUMENTS

| | | |
|---|---|---|
| CN | 101631833 | 1/2010 |
| CN | 102433005 A | 5/2012 |
| CN | 103045159 | 4/2013 |
| CN | 103146203 | 6/2013 |
| CN | 103497488 A | 1/2014 |
| CN | 104231631 | 12/2014 |
| JP | 552154856 A | 12/1977 |
| JP | H09111124 A | 4/1997 |
| JP | 2000508369 A | 7/2000 |
| JP | 2005215500 A | 8/2005 |
| JP | 2007012876 A | 1/2007 |
| JP | 2007063299 A | 3/2007 |
| JP | 2011127074 A | 6/2011 |
| JP | 2013095862 | 5/2013 |
| WO | 2006077667 A1 | 7/2006 |
| WO | WO 2014/099132 | * 6/2014 |

* cited by examiner

Primary Examiner — Marc S Zimmer
(74) Attorney, Agent, or Firm — Norton Rose Fulbright US LLP

(57) ABSTRACT

Provided are a halogen-free phosphorus-free silicon resin composition, and prepreg and laminated board using the same, and printed circuit board, the silicon resin composition comprising the following components in parts by solid weight: 50-90 parts of an organic silicon resin, 20-80 parts of a vinyl-terminated silicon oil, 0.1-5 parts of a viscosity enhancing agent, 0-60 parts of a filler, 0.0001-0.5 parts of a catalyst, and 0.00001-0.1 parts of an inhibitor, a mole ratio between Si—H in a cross-linking agent and Si-Vi in the organic silicon resin being 1.0-1.7. The resin body of the resin composition is a thermosetting silicon resin, and the laminated board prepared thereby has good heat and flame resistance and an extremely low dielectric constant (Dk) and dielectric loss (Df).

19 Claims, No Drawings

HALOGEN-FREE AND PHOSPHORUS-FREE SILICONE RESIN COMPOSITION, PREPREG, LAMINATE BOARD, COPPER-CLAD PLATE USING THE SAME, AND PRINTED CIRCUIT BOARD

CROSS REFERENCE TO RELATED APPLICATIONS

This application is a § 371 of International Application No. PCT/CN2015/083407 filed Jul. 6, 2015, and claims priority from Chinese Patent Application No. 201410827640.X filed Dec. 26, 2014, each of which is incorporated herein by reference in its entirety for all purposes.

FIELD OF THE INVENTION

The present invention relates to a halogen- and phosphorus-free, low-dielectric thermosetting resin composition and a prepreg, a laminate, a copper-clad laminate and a printed circuit board produced therefrom.

BACKGROUND OF THE INVENTION

With the rapid development of information industry, the development of modern high-frequency communications has put forward higher and higher requirements for the electrical properties of materials, the copper-clad laminates used on the high frequency circuits must have good dielectric properties, which requiring the substrate materials to have a lower dielectric constant and a smaller dielectric dissipation factor. Generally, the signal propagation velocity within the conducting wire in the circuit board satisfies the equation $V=K*C/\varepsilon^2$, wherein C is the velocity of light, $\varepsilon$ is the dielectric constant, and K is a constant. It can be seen that if $\varepsilon$ is smaller, the propagation velocity is faster. In addition, the transmission loss in the signal propagation is related to the loss within the conductor and the loss within the medium. The loss within the conductor is in direct proportion to the square root of $\varepsilon$, and the loss within the medium is related to the square root of $\varepsilon$ and the loss tangent. Therefore, the use of substrate materials having low dielectric constant and low dielectric dissipation factor facilitates the high speed transmission of signals and the reduction in the loss of signals.

However, at present, the dielectric constant (Dk) of the ordinary FR-4 under the condition of 1 GHz is between 4.3 and 4.8, and its dielectric dissipation factor (Df) is between 0.02 and 0.025, which cannot satisfy the transmission speed of high frequency signals and the integrity of signal transmission.

Since the outer side of the main chain of the silicone resin macromolecule has a layer of non-polar organic groups and the macromolecular chain has molecular symmetry, it has excellent electrical insulation properties, its dielectric constant and dielectric loss tangent value vary very little within a wide temperature range and frequency range, which meanwhile can remain constant at 200° C. or less and can act as an ultrahigh frequency insulation material used at 350° C. In a variety of curing ways of silicone resin, the reaction between —CH=CH$_2$ and —Si—H catalyzed by platinum is under mild conditions, no small molecule will be released when curing, and no bubble will be generated, thus it has very superior electrical properties.

OBJECTS OF THE INVENTION

In view of the above, an object of the present invention is to provide a halogen- and phosphorus-free, low-dielectric silicone resin composition and a prepreg, a laminate, a copper-clad laminate and a printed circuit board using the same, it may have excellent dielectric properties while maintaining good flame retardancy.

SUMMARY OF THE INVENTION

In order to achieve the above object, the present invention adopts the following technical solution:

A silicone resin composition, wherein in parts by weight of the solids, the silicone resin composition comprises:

50-90 parts of an organic silicone resin;
20-80 parts of a vinyl-terminated silicone oil;
0.0001-0.5 part of a catalyst; and
0.00001-0.1 part of an inhibitor.

DETAILED DESCRIPTION

Preferably, the silicone resin composition further comprises a crosslinking agent, and the crosslinking agent being crosslinked with the organic silicone resin.

Preferably, the crosslinking agent is any one or a mixture of at least two of methyl hydrogen silicone oil, methylphenyl hydrogen silicone oil, methyl hydrogen silicone resin or methylphenyl hydrogen silicone resin; wherein the molar ratio of Si—H (silicon-hydrogen) in the crosslinking agent to the Si-Vi (silicon-vinyl) in the organic silicone resin is 1.0-1.7, for example 1.05, 1.1, 1.15, 1.2, 1.25, 1.3, 1.35, 1.4, 1.45, 1.5, 1.55, 1.6 or 1.65. The molar ratio of Si—H (silicon-hydrogen) and Si-Vi (silicon-vinyl) is ideally calculated as 1.0. However, due to the Si—H (silicon-hydrogen) in the crosslinking agent itself is prone to self-reaction to generate hydrogen and remove the Si—H under high temperatures, the molar ratio of Si—H to Si-Vi may be higher when in the actual application, but the molar ratio of Si—H to Si-Vi cannot be too high, otherwise more hydrogen will be generated, which will result in the formation of holes in the laminates after curing, thus it is appropriate for the molar ratio of Si—H to Si-Vi being 1.0-1.7, and preferably being 1.2-1.6.

Preferably, the mass fraction of the hydrogen contained in the crosslinking agent is 0.5-1.6%, for example 0.6%, 0.7%, 0.8%, 0.9%, 1.0%, 1.1%, 1.2%, 1.3%, 1.4% or 1.5%, and preferably 0.7-1.3%.

In the present invention, the amount of crosslinking agent is calculated through the molar ratio of Si—H (silica-hydrogen)/Si-Vi (silicon-vinyl) and the content and parts by mass of vinyl in the organic silicone resin.

In the present invention, the content of the organic silicone resin is for example, 53 parts, 56 parts, 59 parts, 63 parts, 67 parts, 71 parts, 75 parts, 79 parts, 83 parts, 86 parts or 89 parts.

The content of the vinyl-terminated silicone oil is for example, 24 parts, 28 parts, 32 parts, 36 parts, 40 parts, 44 parts, 48 parts, 52 parts, 56 parts, 60 parts, 64 parts, 68 parts, 72 parts or 76 parts.

The content of the catalyst is for example, 0.0001 part, 0.0005 part, 0.001 part, 0.005 part, 0.01 part, 0.05 part, 0.1 part, 0.3 part or 0.5 part.

The content of the inhibitor is for example, 0.00003 part, 0.00005 part, 0.0001 part, 0.0005 part, 0.001 part, 0.005 part, 0.01 part, 0.05 part or 0.09 part.

The curing way of the silicone resin composition of the present invention is reacting

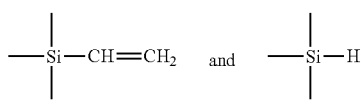

under the catalytic action of a platinum catalyst to obtain a crosslinked network structure, and the specific reaction formula is as follows:

In the present invention, the organic silicone resin is a thermosetting silicone resin, which comprises a methylvinyl silicone resin and/or a methylphenylvinyl silicone resin, and both resins can be subjected to an addition reaction by a crosslinking agent, without by-products such as small molecules being generated, and has superior electrical properties. Meanwhile, the lower the mass fraction of vinyl is, the more the resins tend to be silicone rubbers, and the lower the hardness is after curing, which will affect the use of laminates, while the higher the mass fraction of vinyl is, the better the thermosetting property of resins is, but the resins are more fragile, and the mechanical properties is decreased. Therefore, the mass fraction of vinyl in the organic silicone resin is 0.5-8.0%, for example 1%, 1.5%, 2%, 2.5%, 3%, 3.5%, 4%, 4.5%, 5%, 5.5%, 6%, 6.5%, 7% or 7.5%, preferably, the mass fraction of vinyl is 1.0-6.0%.

In the present invention, the vinyl-terminated silicone oil is an active diluent of the resin composition, including methyl vinyl-terminated silicone oil and/or a methylphenyl vinyl-terminated silicone oil, the vinyl-terminated silicone oil itself will participate in the reaction, when the viscosity of the vinyl-terminated silicone oil is lower, the effect of dilution and dissolution of the silicone resin is better, but it is fragile after curing, whereas when the viscosity of the vinyl-terminated silicone oil is higher, it can act a toughening effect on the silicone resins, meanwhile the dilution effect on the silicone resin can be reduced, thus its viscosity is 200-10,000 mPa·s, and preferably 500-8,000 mPa·s.

In the present invention, the silicone resin composition further comprises a catalyst, which is a platinum catalyst, preferably a platinum-methylvinyl complex and/or a platinum-methylphenylvinyl complex, preferably the viscosity of the catalyst is 100-10,000 mPa·s.

In the present invention, the inhibitor is any one or a mixture of at least two of an alkynyl-containing compound, a polyvinyl group-containing compound, a N-containing organic compound, a P-containing organic compound or an S-containing organic compound.

In the present invention, the silicone resin composition further comprises a tackifier.

In the present invention, the tackifier is an organic compound containing any one or a combination of at least two of —OCH$_3$, —OCH$_2$CH$_3$,

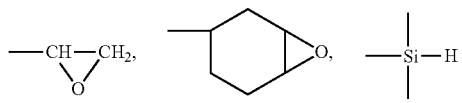

or —CH=CH$_2$. Such kind of organic compounds is mainly used to improve the peel strength with the copper foil in the resin composition.

The content of the tackifier is 0.1-5 parts, for example, 0.5 part, 1 part, 1.5 parts, 2 parts, 2.5 parts, 3 parts, 3.5 parts, 4 parts or 4.5 parts.

In the present invention, the silicone resin composition further comprises 0-60 parts of a filler; the filler is any one or a mixture of at least two of alumina, aluminum hydroxide, silica, zinc oxide, mica powder, aluminum nitride, boron nitride, silicon carbide, barium sulfate, titanium dioxide, zinc borate, fumed silica, talc powder, magnesium hydroxide or boehmite.

The content of the filler is for example, 5 parts, 14 parts, 18 parts, 22 parts, 26 parts, 30 parts, 34 parts, 38 parts, 42 parts, 46 parts, 50 parts, 54 parts or 58 parts.

In the present invention, the particle size of the filler is not particularly limited, but is preferably 10 μm or less, more preferably 5 μm or less.

Preferably, the silicone resin composition comprises by weight fraction of:
50-90 parts of an organic silicone resin;
20-80 parts of a vinyl-terminated silicone oil;
0.1-5 parts of a tackifier;
0-60 parts of a filler;
0.0001-0.5 part of a catalyst; and
0.00001-0.1 part of an inhibitor;
wherein, the crosslinking agent of the organic silicone resin is any one or a mixture of at least two of methyl hydrogen silicone oil, methylphenyl hydrogen silicone oil, methyl hydrogen silicone resin or methylphenyl hydrogen silicone resin; and the molar ratio of Si—H in the crosslinking agent to the Si-Vi in the organic silicone resin is 1.0-1.7.

Term "comprise(s)" as used in the present invention means that in addition to the described components, other components may be included, which impart different characteristics to the silicone resin composition. Besides, term "comprise(s)" as used in the present invention can also be replaced by closed phrase "is (are)" or "consist(s) . . . of".

For example, the silicone resin composition may contain various additives. As specific examples, flame retardants, antioxidants, heat stabilizers, antistatic agents, ultraviolet absorbers, pigments, colorants or lubricants, etc. can be listed. These various additives may be used singly or in a combination of two or more.

The second object of the present invention is to provide a resin glue solution which is obtained by dissolving or dispersing the silicone resin composition as described above in a solvent.

The solvent used in the present invention is not particularly limited. As specific examples, toluene, xylene, n-hexane, cyclohexane or isopropanol, etc. can be listed.

The third object of the present invention is to provide a prepreg, comprising a reinforcing material and the silicone resin composition as described above attached to the reinforcing material after impregnation and drying.

The method for preparing the prepreg in the examples is as follows:

dissolving the organic silicone resin in a vinyl-terminated silicone oil, and impregnating a reinforcing material such as a flaked fiberglass substrate with the organic silicone resin composition prepared from a crosslinking agent, an inhibitor, a catalyst, a tackifier, a filler, and optionally an adjuvant, then directly pressing under certain pressure and temperature to obtain the prepreg.

The fourth object of the present invention is to provide a laminate, which comprises at least one prepreg as described above and is obtained by hot press molding at least one prepreg as described above.

The fifth object of the present invention is to provide a copper-clad laminate, which comprises at least one laminated prepreg as described above and a copper foil pressed on one side or both sides of the laminated prepreg.

Compared with the prior art, the present invention has the following beneficial effects:

The silicone resin composition is obtained by using the organic silicone resin as the main body of the resin together with appropriate amounts of the vinyl-terminated silicone oil, the crosslinking agent, the tackifier, the filler, the catalyst, the inhibitor and optionally the adjuvant. The laminate prepared from the above silicone resin composition has excellent mechanical properties, thermal resistance and flame retardancy, and can achieve V-0 flame retardancy in the absence of halogen and phosphorus, meanwhile has a very low dielectric constant (Dk) and dielectric dissipation factor (Df).

EXAMPLES

The technical solution of the present invention will be further described below by way of specific embodiments.

Example 1

The formulation was designed according to Si—H (silica-hydrogen)/Si-Vi (silicon-vinyl)=1.6 (molar ratio), 90 parts of methylphenylvinyl silicone resin (the mass fraction of vinyl of 1.0%) was weighed and dissolved into 30 parts of methylphenyl vinyl-terminated silicone oil having a viscosity of 500 mPa·s, then 4.10 parts of methylphenyl hydrogen silicone oil (the mass fraction of the hydrogen contained therein of 1.3%) and 0.1 part of tackifier were added after uniformly dissolved, 0.001 part of hexynol was weighed after uniformly stirring under high speed, then 0.01 part of platinum-methylphenylvinyl complex was added after stirring for 30 minutes, 15 parts of silica fine powder with 3.5 μm of particle size was added after continuously stirring for 30 minutes, then the mixture was stirred at room temperature for 1 hour, emulsified for 20 minutes to obtain the silicone resin composition.

A glass fiber cloth having a weight of 104 g/cm² was impregnated with the silicone resin composition prepared above, and 8 prepregs were directly laminated, 35 μm of electrolytic copper foil was provided on the upper and lower surfaces of the laminate respectively, which was pressure-molded at 200° C., a surface pressure of 10 kgf/cm² and 30 mmHg or less of vacuum for 180 minutes to obtain a double-sided copper-clad laminate having a thickness of 1.0 mm.

Example 2

The formulation was designed according to Si—H/Si-Vi=1.2 (molar ratio), 70 parts of methylvinyl silicone resin (the mass fraction of vinyl of 3.5%) was weighed and dissolved into 50 parts of methyl vinyl-terminated silicone oil having a viscosity of 3000 mPa·s, then 10.9 parts of methyl hydrogen silicone oil (the mass fraction of the hydrogen contained therein of 1.0%) and 0.5 part of tackifier were added after uniformly dissolved, 0.00005 part of hexynol was weighed after uniformly stirring under high speed, then 0.005 part of platinum-methyl vinyl complex was added after stirring for 30 minutes, 10 parts of silica fine powder with 5 μm of particle size and 15 parts of alumina with 3.5 μm of particle size were added after continuously stirring for 30 minutes, then the mixture was stirred at room temperature for 1 hour, emulsified for 20 minutes to obtain the silicone resin composition.

A double-sided copper-clad laminate having a thickness of 1.0 mm was obtained in the same manner as that in Example 1 except that the resin composition prepared above was used.

Example 3

The formulation was designed according to Si—H/Si-Vi=1.5 (molar ratio), 50 parts of methylvinyl silicone resin (the mass fraction of vinyl of 7.5%) was weighed and dissolved into 70 parts of methyl vinyl-terminated silicone oil having a viscosity of 8000 mPa·s, then 26.1 parts of methyl hydrogen silicone oil (the mass fraction of the hydrogen contained therein of 0.8%) and 0.1 part of tackifier were added after uniformly dissolved, 0.1 part of tetramethyltetravinylcyclotetrasiloxane (D4vi) was weighed after uniformly stirring under high speed, then 0.0001 part of platinum-methyl vinyl complex was added after stirring for 30 minutes, 50 parts of silica fine powder with 5 μm of particle size was added after continuously stirring for 30 minutes, then the mixture was stirred at room temperature for 1 hour, emulsified for 20 minutes to obtain the silicone resin composition.

A double-sided copper-clad laminate having a thickness of 1.0 mm was obtained in the same manner as that in Example 1 except that the resin glue solution prepared above was used.

Comparative Example 1

The formulation was designed according to Si—H (silica-hydrogen)/Si-Vi (silicon-vinyl)=1.9 (molar ratio), 90 parts of methylphenylvinyl silicone resin (the mass fraction of vinyl of 1.0%) was weighed and dissolved into 30 parts of methylphenyl vinyl-terminated silicone oil having a viscosity of 500 mPa·s, then 4.87 parts of methylphenyl hydrogen silicone oil (the mass fraction of the hydrogen contained therein of 1.3%) and 0.1 part of tackifier were added after uniformly dissolved, 0.001 part of hexynol was weighed after uniformly stirring under high speed, then 0.01 part of platinum-methylphenylvinyl complex was added after stirring for 30 minutes, 15 parts of silica fine powder with 3.5 μm of particle size was added after continuously stirring for 30 minutes, then the mixture was stirred at room temperature for 1 hour, emulsified for 20 minutes to obtain the silicone resin composition.

A double-sided copper-clad laminate having a thickness of 1.0 mm was obtained in the same manner as that in Example 1 except that the resin composition prepared above was used.

Comparative Example 2

The formulation was designed according to Si—H/Si-Vi=1.2 (molar ratio), 70 parts of methylvinyl silicone resin (the mass fraction of vinyl of 10.0%) was weighed and dissolved into 50 parts of methyl vinyl-terminated silicone oil having a viscosity of 3000 mPa·s, then 31.1 parts of methyl hydrogen silicone oil (the mass fraction of the hydrogen contained therein of 1.0%) and 0.5 part of tackifier were added after uniformly dissolved, 0.00005 part of hexynol was weighed after uniformly stirring under high speed, then 0.005 part of platinum-methyl vinyl complex was added after stirring for 30 minutes, 10 parts of silica fine powder with 5 μm of particle size and 15 parts of alumina with 3.5 μm of particle size were added after continuously stirring for 30 minutes, then the mixture was stirred at room temperature for 1 hour, emulsified for 20 minutes to obtain the silicone resin composition.

A double-sided copper-clad laminate having a thickness of 1.0 mm was obtained in the same manner as that in Example 1 except that the resin composition prepared above was used.

Comparative Example 3

The formulation was designed according to Si—H/Si-Vi=0.7 (molar ratio), 50 parts of methylvinyl silicone resin (the mass fraction of vinyl of 7.5%) was weighed and dissolved into 70 parts of methyl vinyl-terminated silicone oil having a viscosity of 8000 mPa·s, then 12.2 parts of methyl hydrogen silicone oil (the mass fraction of the hydrogen contained therein of 0.8%) and 0.1 part of tackifier were added after uniformly dissolved, 0.1 part of tetramethyltetravinylcyclotetrasiloxane (D4vi) was weighed after uniformly stirring under high speed, then 0.0001 part of platinum-methyl vinyl complex was added after stirring for 30 minutes, 50 parts of silica fine powder with 5 μm of particle size was added after continuously stirring for 30 minutes, then the mixture was stirred at room temperature for 1 hour, emulsified for 20 minutes to obtain the silicone resin composition.

A double-sided copper-clad laminate having a thickness of 1.0 mm was obtained in the same manner as that in Example 1 except that the resin glue solution prepared above was used.

Comparative Example 4

70.0 parts of methylphenyl silicone resin was weighed and dissolved in a 50.0 parts of toluene solvent, then stirred to dissolve it completely. After the silicone resin was completely dissolved, 0.005 part of aluminium acetylacetonate and 0.5 part of the tackifier were added, 10 parts of silica fine powder with 5 μm of particle size and 15 parts of alumina with 3.5 μm of particle size were added after continuously stirring for 30 minutes, then the mixture was stirred at room temperature for 1 hour, emulsified for 20 minutes to obtain the silicone resin composition. A glass fiber cloth having a weight of 104 g/cm$^2$ was impregnated with the silicone resin composition prepared above, then baked in an oven at 170° C. for 5 minutes to obtain a prepreg.

A double-sided copper-clad laminate having a thickness of 1.0 mm was obtained in the same manner as that in Example 1 except that the prepreg prepared above was used.

Effect Confirmation Test:

1. Dielectric Property Test

The test method for the plate capacitance was carried out with reference to IPC-TM-650 2.5.5.9;

The test method for SPDR was carried out with reference to IPC-TM-650 2.5.5.13.

2. Flammability Test

The flammability test was carried out according to the UV94 method.

3. Flexural Strength Test

The flexural strength test was carried out with reference to IPC-TM-650 2.4.4 (12/94B Version).

4. Appearance Condition

Appearance inspection: the surface of the copper-clad laminate was visually observed;

Interior inspection: Sections were made, and observed with a scanning electron microscope, the test results were as follows:

TABLE 1

Test results of a copper-clad laminate

| Test item | Test method | Example 1 | Example 2 | Example 3 | Comparative Example 1 | Comparative Example 2 | Comparative Example 3 | Comparative Example 4 |
|---|---|---|---|---|---|---|---|---|
| Parts of the silicone resin | — | 90 | 70 | 50 | 90 | 70 | 50 | 70 |
| The content of vinyl (%) | | 1.0 | 3.5 | 7.5 | 1.0 | 10.0 | 7.5 | — |
| Si—H/Si-Vi (molar ratio) | | 1.6 | 1.2 | 1.5 | 1.9 | 1.2 | 0.7 | — |
| The content of catalyst | | 0.01 | 0.005 | 0.0001 | 0.01 | 0.005 | 0.0001 | 0.005 |
| The content of inhibitor | | 0.001 | 0.00005 | 0.1 | 0.001 | 0.00005 | 0.1 | — |
| The content of filler | | 15 | 10 + 15 | 50 | 15 | 10 + 15 | 50 | 10 + 15 |
| Dielectric constant (Dk) | 1 MHz/plate capacitance | 3.68 | 3.63 | 3.65 | 3.70 | 3.69 | 3.64 | 3.78 |
| Dielectric dissipation factor (Df) | | 0.0016 | 0.0018 | 0.0016 | 0.0017 | 0.0018 | 0.0017 | 0.0023 |
| Dielectric constant (Dk) | 1 GHz/plate capacitance | 3.59 | 3.60 | 3.61 | 3.58 | 3.59 | 3.60 | 3.67 |
| Dielectric dissipation factor (Df) | | 0.0048 | 0.0043 | 0.0046 | 0.0047 | 0.0046 | 0.0046 | 0.0054 |
| Dielectric constant (Dk) | 10 GHz/SPDR | 3.55 | 3.56 | 3.58 | 3.58 | 3.56 | 3.59 | 3.61 |
| Dielectric dissipation factor (Df) | | 0.0082 | 0.0072 | 0.0078 | 0.007 | 0.0075 | 0.0076 | 0.0082 |

TABLE 1-continued

Test results of a copper-clad laminate

| Test item | Test method | Example 1 | Example 2 | Example 3 | Comparative Example 1 | Comparative Example 2 | Comparative Example 3 | Comparative Example 4 |
|---|---|---|---|---|---|---|---|---|
| Flammability | — | V-0 | V-0 | V-0 | V-0 | V-0 | V-1 | V-0 |
| Flexural strength (N/mm²) | — | 307.8 | 332.5 | 314.4 | 188.4 | 176.4 | 153.4 | 198.6 |
| Appearance condition | — | No bad defect | No bad defect | No bad defect | A few holes in the interior | Cracks in the interior | Low hardness, and crinkling of the copper foil | No bad defect |

Analysis of physical properties: As can be seen from the test results, the silicone resin compositions of Examples 1-3 have very low Dk/Df, which facilitates the high speed transmission of signals and the reduction in the loss of signals, meanwhile achieving halogen- and phosphorus-free flame retardancy, and superior mechanical properties as well. When Comparative Example 1 was compared with Example 1, the Si—H/Si-Vi=1.9 (molar ratio), the amount of hydrogen silicone oil was excess and hydrogen would be released at high temperature, resulting in a small amount of bubbles and holes inside the laminate. When Comparative Example 2 was compared with Example 2, the content of vinyl was 10.0 parts, and the amount of hydrogen silicone oil was 31.1 parts through calculation, too much vinyl would result in the friability after curing the resins and the reduction in mechanical properties; and when Comparative Example 3 was compared with Example 3, the Si—H/Si-Vi=0.7 (molar ratio), the amount of the hydrogen silicone oil cannot make the vinyl silicone resin completely cure, resulting in the laminate having low hardness, poor mechanical properties, and easy crinkling on the surface of the copper foil; While Comparative Example 4 is a condensed-type silicone resin, the electrical properties of which was worse than the vinyl silicone resin due to small molecules would be released when curing.

As can be seen from the test results of Example 4 and Comparative Example 5, since the addition-type silicone resin would not release small molecules when reacting and has better voltage resistance and better dip soldering resistance, and the addition-type silicone resin can use an active diluent which has no pollution to the environment and plays a good toughening effect to the silicone resins, the layer of resins will be free from dry linting and cracking.

Applicant has stated that although the detailed methods of the present invention have been described by the above embodiments in the present invention, the present invention is not limited to the detailed methods described above, that is to say, it is not meant that the present invention has to be implemented depending on the above detailed methods. It will be apparent to those skilled in the art that any improvements made to the present invention, equivalent replacements to the raw materials of the products of the present invention and addition of adjuvant ingredients, and selections of the specific implementations, etc., all fall within the protection scope and the disclosure scope of the present invention.

The invention claimed is:

1. A silicone resin composition, wherein in parts by weight of the solids, the silicone resin composition comprises:

50-90 parts by weight of an organic silicone resin;
20-80 parts by weight of a vinyl-terminated silicone oil;
0.0001-0.5 part by weight of a platinum catalyst; and
0.00001-0.1 part by weight of an inhibitor; and
0.1-5 parts of a tackifier;

wherein the catalyst has a viscosity of 100-10,000 mPa·s, and wherein the tackifier is an organic compound containing any one or a combination of at least two of —OCH$_3$, —OCH$_2$CH$_3$,

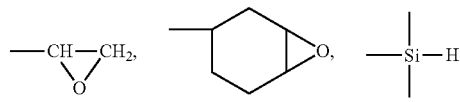

or —CH=CH$_2$.

2. The silicone resin composition according to claim 1, wherein the organic silicone resin comprises at least one member selected from the group consisting of a methyl vinyl silicone resin and a methylphenylvinyl silicone resin, and wherein the mass fraction of the vinyl in the organic silicone resin is 0.5-8.0%.

3. The silicone resin composition according to claim 1, wherein the silicone resin composition further comprises a crosslinking agent, and wherein the crosslinking agent comprises at least one member selected from the group consisting of methyl hydrogen silicone oil, methylphenyl hydrogen silicone oil, methyl hydrogen silicone resin and methylphenyl hydrogen silicone resin.

4. The silicone resin composition according to claim 3, wherein the molar ratio of Si—H in the crosslinking agent to the Si-Vi in the organic silicone resin composition is 1.0-1.7.

5. The silicone resin composition according to claim 3, wherein the mass fraction of the hydrogen contained in the crosslinking agent is 0.5-1.6%.

6. The silicone resin composition according to claim 5, wherein, the vinyl-terminated silicone oil comprises at least one member selected from the group consisting of a methyl vinyl-terminated silicone oil and a methylphenyl vinyl-terminated silicone oil having a viscosity of 200-10,000 mPa·s.

7. The silicone resin composition according to claim 1, wherein the silicone resin composition contains 5 parts of the tackifier.

8. The silicone resin composition according to claim 1, wherein, the tackifier is —OCH$_3$.

9. The silicone resin composition according to claim 1, wherein the silicone resin composition further comprises 0-60 parts of a filler.

10. The silicone resin composition according to claim 9, wherein, the filler comprises at least one member selected from the group consisting of alumina, aluminum hydroxide, silica, zinc oxide, mica powder, aluminum nitride, boron nitride, silicon carbide, barium sulfate, titanium dioxide, zinc borate, fumed silica, talc powder, magnesium hydroxide and boehmite.

11. The silicone resin composition according to claim 9, wherein the filler has a particle size of 10 μm or less.

12. The silicone resin composition according to claim 1, wherein the catalyst is a platinum-methyl vinyl complex and/or a platinum-methylphenylvinyl complex.

13. The silicone resin composition according to claim 1, wherein the inhibitor comprises at least one member selected from the group consisting of an alkynyl-containing compound, a polyvinyl group-containing compound, a N-containing organic compound, a P-containing organic compound and an S-containing organic compound.

14. The silicone resin composition according to claim 1, wherein the silicone resin composition comprises by weight fraction of:
50-90 parts of the organic silicone resin;
20-80 parts of the vinyl-terminated silicone oil;
0.1-5 parts of a tackifier;
0-60 parts of a filler;
0.0001-0.5 part of the platinum catalyst; and
0.00001-0.1 part of the inhibitor;
wherein the crosslinking agent of the organic silicone resin at least one member selected from the group consisting of methyl hydrogen silicone oil, methylphenyl hydrogen silicone oil, methyl hydrogen silicone resin or methylphenyl hydrogen silicone resin; and
wherein the molar ratio of Si—H in the crosslinking agent to the Si-Vi in the organic silicone resin is 1.0-1.7; and
wherein the catalyst has a viscosity of 100-10,000 mPa·s.

15. A resin glue solution, wherein it is obtained by dissolving or dispersing the silicone resin composition according to claim 1 in a solvent.

16. A prepreg comprising a reinforcing material and the silicone resin composition according to claim 1 attached to the reinforcing material after impregnation and drying.

17. A laminate, wherein the laminate comprises at least one prepreg according to claim 16.

18. A copper-clad laminate, wherein the copper-clad laminate comprises at least one laminated prepreg according to claim 16 and a copper foil pressed on one side or both sides of the laminated prepreg.

19. A printed circuit board, wherein the printed circuit board comprises at least one prepreg according to claim 16.

* * * * *